United States Patent [19]

Kagami

[11] Patent Number: 5,264,918
[45] Date of Patent: Nov. 23, 1993

[54] METHOD AND DEVICE FOR DETECTING THE CENTER OF A WAFER

[75] Inventor: Fumito Kagami, Kofu, Japan

[73] Assignee: Tokyo Electron Yamanashi Limited, Nirasaki, Japan

[21] Appl. No.: 850,811

[22] Filed: Mar. 13, 1992

[30] Foreign Application Priority Data

Mar. 13, 1991 [JP] Japan .................. 3-72058

[51] Int. Cl.⁵ ............................ H01L 21/68
[52] U.S. Cl. ........................ 356/400; 356/150
[58] Field of Search .............. 356/150, 399, 400, 426

[56] References Cited

U.S. PATENT DOCUMENTS

| 3,604,940 | 9/1971 | Matthews | 356/426 |
| 4,607,035 | 3/1990 | Galburt et al. | 356/400 |
| 5,125,791 | 6/1992 | Volovich | 356/400 |

FOREIGN PATENT DOCUMENTS 2-205049  8/1990  Japan .

Primary Examiner—Richard A. Rosenberger
Attorney, Agent, or Firm—Oblon, Spivak, McClelland, Maier & Neustadt

[57] ABSTRACT

A wafer center detecting method comprises steps of giving turn to a wafer held by a holder, optically detecting two points at which the true rim line of the wafer crosses the fictitious rim line thereof obtained when the center of the wafer is in accord with the rotation center of the holder, and measuring an angle formed by these two intersecting points relative to a reference point, obtaining from the angle formed by the two intersecting points a direction in which the center of the wafer is shifted from the rotation center of the holder, obtaining a central angle formed by the two intersecting points relative to the rotation center of the holder, and obtaining, on the basis of the central angle and a previously-measured wafer radius, the extent to which the center of the wafer is shifted from the rotation center of the holder.

17 Claims, 10 Drawing Sheets

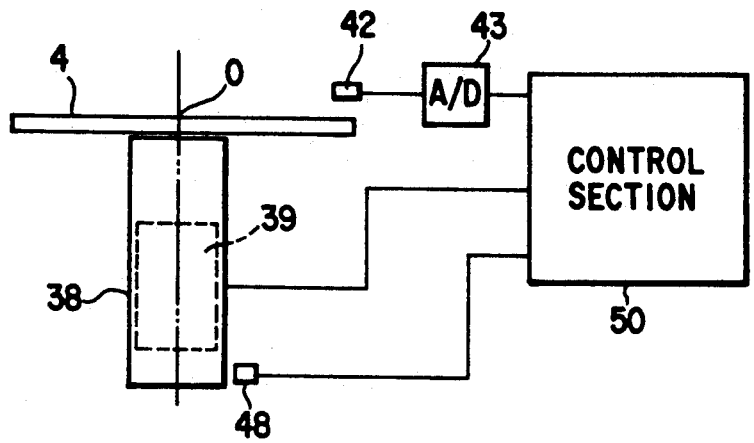
F I G. 4
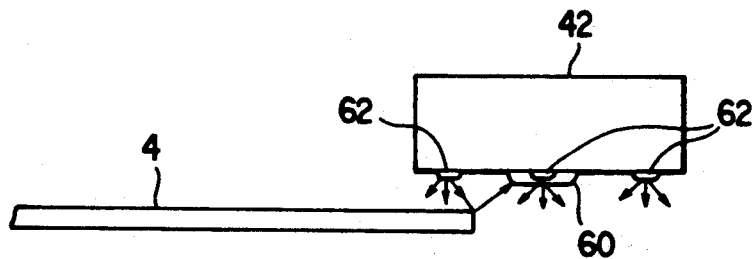
F I G. 5

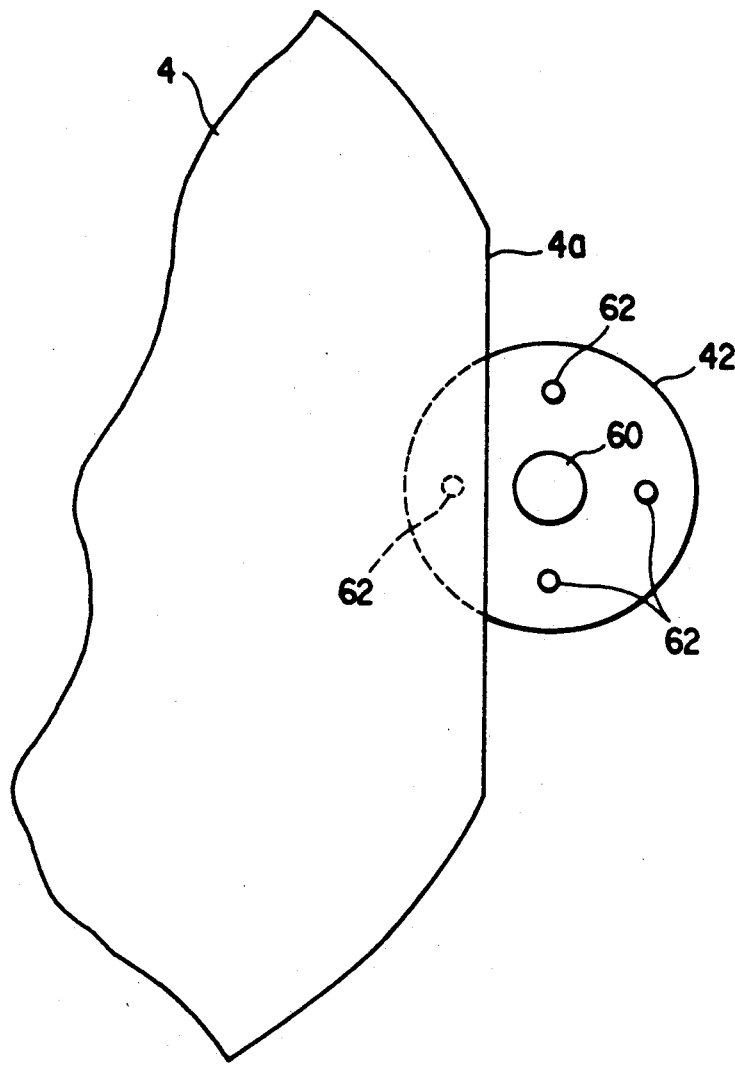
F I G. 6

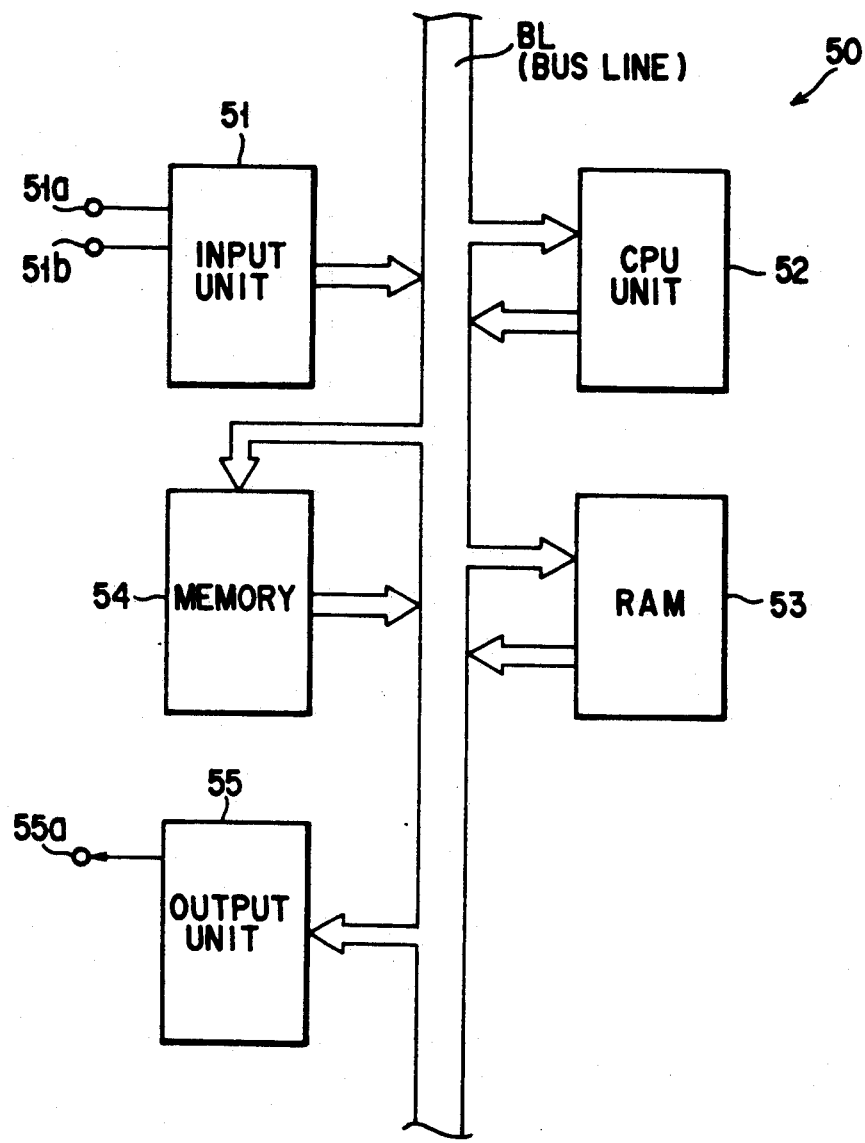
F I G. 9

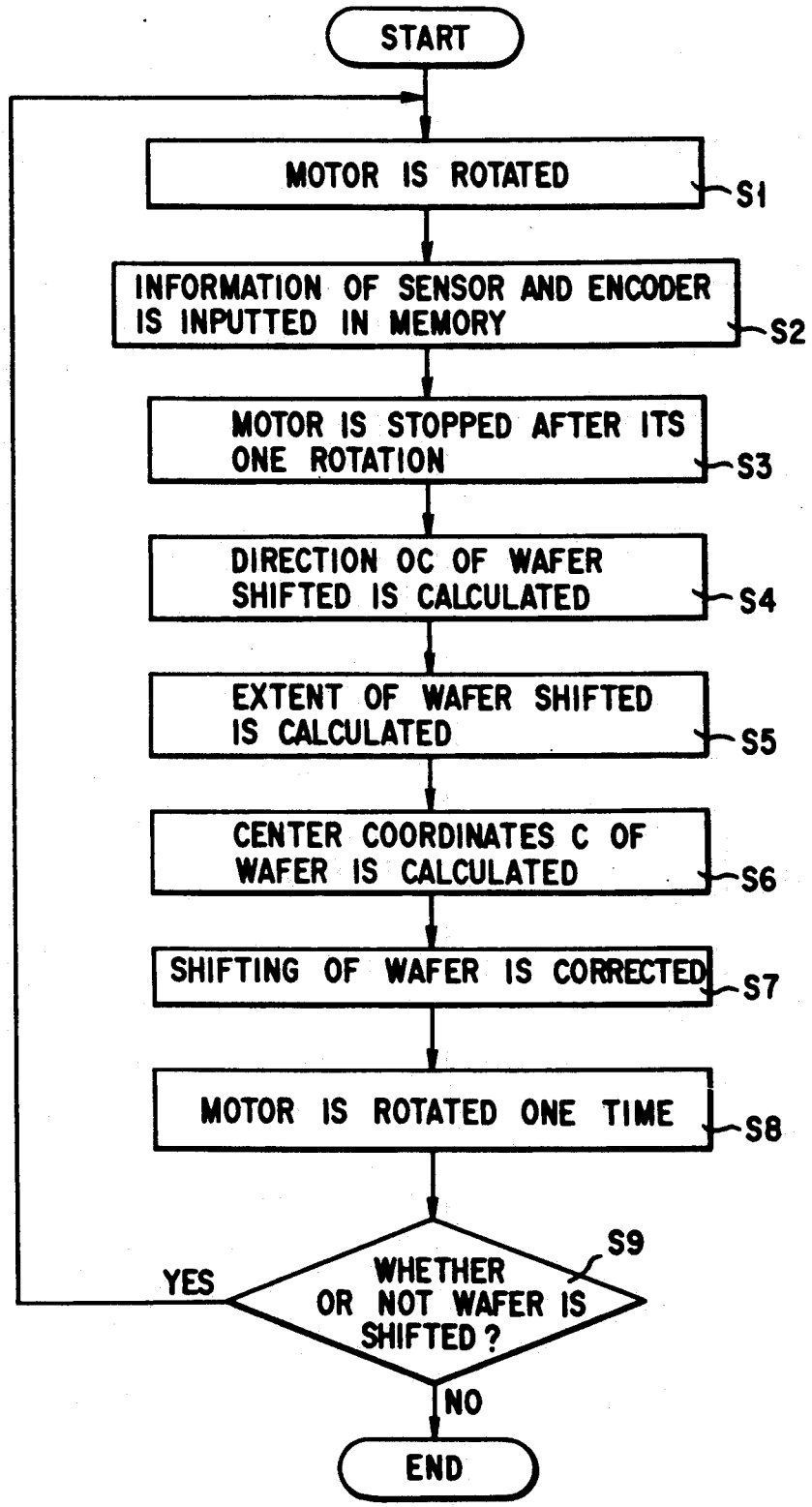
F I G. 10

METHOD AND DEVICE FOR DETECTING THE CENTER OF A WAFER

BACKGROUND OF THE INVENTION

1. Field of the Invention

The present invention relates to a method and a device for detecting the center of a wafer and, more particularly, it relates to a method and a device for detecting how the center of the wafer is shifted from the rotation center of a holder means on which the wafer is freely rotatably held.

2. Description of the Related Art

Various kinds of conventional semiconductor manufacturing apparatus including probing, etching and ashing ones carry out the aligning of wafers relative to the holder means. In the case of the apparatus for probing electric characteristics of chips on the wafer, rough pre-alignment of wafers is carried out by the prealignment device prior to close and accurate alignment of them.

This pre-alignment comprises aligning the center of the wafer with the rotation center of a wafer chuck on which the wafer is freely rotatably held, and positioning the orientation flat of the wafer formed by partly cutting away the wafer.

Japanese Patent Disclosure Hei 2-205049 discloses an apparatus capable of carrying out the pre-alignment optically without contacting the wafer. According to this apparatus, the semiconductor wafer is freely rotatably held on the wafer chuck. A light source is opposed to a light receiving element with the rim of the wafer interposed between them. The amount of light received by the light receiving element is measured while rotating the wafer by the wafer chuck.

When the wafer is shifted from the wafer chuck, the area at which light emitted from the light source is shielded by the wafer changes depending upon the wafer rotated. The amount of light received by the light receiving element is thus changed. Therefore, information relating to the contour of the wafer on the wafer chuck can be obtained from outputs applied from the light receiving element when it receives light. It can be thus detected how the wafer is shifted from the wafer chuck. This allows the wafer to be aligned with the wafer chuck.

In the case of this conventional pre-alignment apparatus, however, a specific linear light receiving element having an effective measuring length of several centimeters is needed. In addition, a light source having a light intensity which allows light uniform over several centimeters to be emitted is also needed. Further, it is needed that analog outputs of the light receiving element are converted into plural digital signals. Therefore, measuring results obtained are likely to change because of the light receiving element and the light source deteriorated as time goes by.

In addition to those opaque wafers which are made of silicon, quartz glass, crystal and gallium arsenic are recently used to make transparent wafers and these transparent wafers allow light to pass through them. When the above-mentioned conventional apparatuses are used relative to the wafers which allow light to pass through them, however, light emitted from the light source can pass through the wafers, thereby making it impossible to detect any change in the amount of light.

SUMMARY OF THE INVENTION

The object of the present invention is therefore to provide a method and a device simpler in structure and capable of more quickly and accurately detecting how the center a wafer is shifted from the rotation center of a holder means on which the wafer is freely rotatably held.

This object of the present invention can be achieved by a method of detecting the center of a wafer comprising steps of giving a turn to the wafer held by a holder means; optically detecting two points at which the true rim line of the wafer crosses the fictitious rim line thereof obtained when the center of the wafer is in accord with the rotation center of the holder means, and measuring an angle formed by these two intersecting points relative to a reference point; obtaining from the angle formed by the two intersecting points a direction in which the center of the wafer is shifted from the rotation center of the holder means; obtaining a central angle formed by the two intersecting points relative to the rotation center of the holder means; and obtaining, on the basis of the central angle and a previously-measured wafer radius, the extent to which the center of the wafer is shifted from the rotation center of the holder means.

The object of the present invention can also be achieved by a device for detecting the center of a wafer comprising a means for holding the wafer freely rotatable; a drive means for rotating the holder means; an optical sensor opposed to the fictitious rim line of the wafer obtained when the center of the wafer is in accord with the rotation center of the holder means so as to optically detect the rim of the wafer; a means for detecting the rotating angle of the holder means; and a means for arithmetically calculating, on the basis of a rotating angle of the holder means obtained when the rim of the rotating wafer is detected by the optical sensor and a previously-measured wafer radius, the direction in and the extent to which the center of the wafer is shifted from the rotation center of the holder means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a circuit diagram for the wafer center detecting device;

FIGS. 5 and 6 are side and bottom views showing on an enlarged scale an optical sensor of the reflector type according to the first embodiment of the present invention;

FIG. 9 is a block diagram showing a control section according to the first embodiment of the present invention;

FIG. 10 is a flow chart showing steps of detecting the center of a wafer;

DETAILED DESCRIPTION OF THE PREFERRED EMBODIMENTS

Some embodiments of the present invention will be described with reference to the accompanying drawings.

FIGS. 1 through 10 show a first embodiment of the present invention wherein a device for detecting the center of a wafer according to the present invention is applied to the semiconductor wafer probe apparatus.

Figure 1:
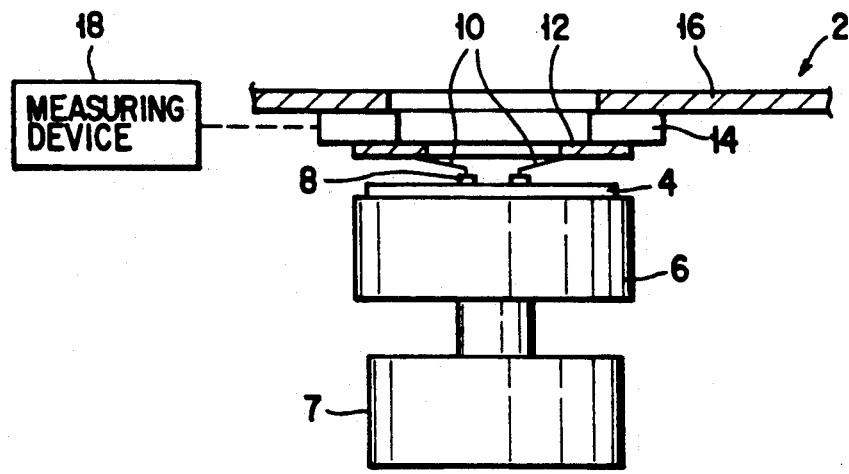
FIG. 1 shows the main portion of the semiconductor wafer probing apparatus to which the present invention is applied.

As shown in FIG. 1, the semiconductor wafer probe apparatus 2 includes a wafer holder 6 movable in directions X and Y and a lifter system 7 for moving the wafer holder 6 up and down. Attached to the top of the wafer holder 6 is a wafer chucking section 37 for suction-holding a semiconductor wafer 4 thereon.

The semiconductor wafer 4 to be probed is prealigned by the well-known alignment system and carried to and fixed on the wafer holder 6. A plurality of rectangular chips each having an electric circuit pattern are previously formed on the semiconductor wafer 4. A plurality of electrode pads 8 which serve as terminals of the electric circuit pattern extend from the rim of each of the chips, having a certain interval between two of them adjacent to each other.

Arranged above the wafer holder 6 are a probe card 12 and a card holder system 14. A plurality of probes 10 which are equal in number to the electrode pads 8 of the semiconductor chip are planted on the probe card 12 and the system 14 for holding the probe card 12 is attached to a support plate 16. A measuring device 18 such as the tester is connected to the probes 10 to check the electrode pads 8 when the probes 10 are contacted with the electrode pads 8.

Figure 2:
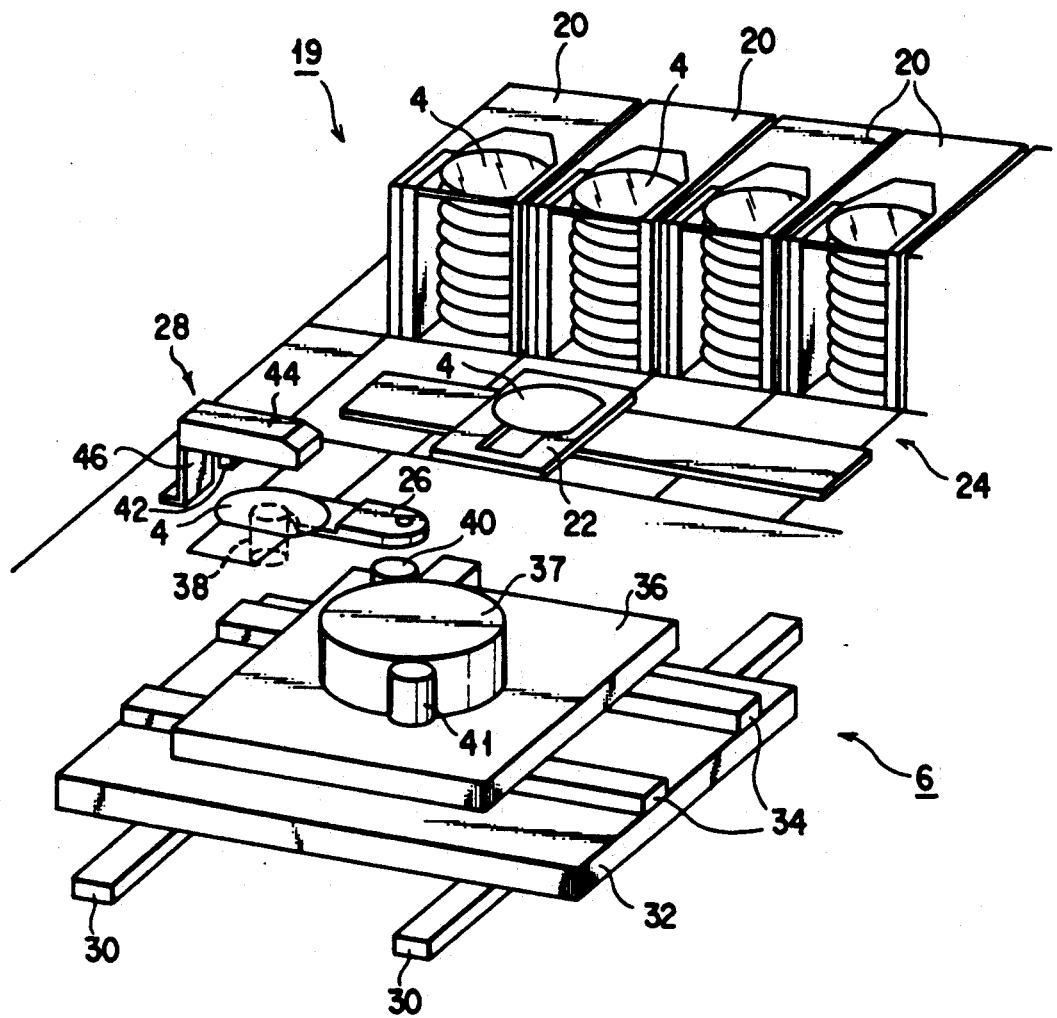
FIG. 2 is a perspective view showing the semiconductor wafer probing apparatus.

The semiconductor wafer probe apparatus 2 is a combination of the wafer holder 6 and a carrier system 19, as shown in FIG. 2. The carrier system 19 includes a loader section 24, a wafer center detecting section 28 and a handling arm 26. The wafers 4 housed in plural wafer cassettes 20 are held and carried one by one by a wafer carrier mechanism 22 at the loader section 24. The handling arm 26 serves to transfer the wafer 4 from the wafer carrier mechanism 22 to the wafer center detecting section 28 while holding it thereon, and transfer it to the wafer holder 6 therefrom.

The wafer holder 6 includes a Y-stage 32 freely slidable on rails 30 which guide the Y-stage 32 in the direction Y. It also includes an X-stage 36 freely slidable on rails 34 which are arranged, perpendicular to each other, on the Y-stage 32 and which guide the X-stage in the direction X. A chucking section 37 is arranged, freely rotatable, on the top of the X-stage 36. A probe grinder 40 and a TV camera 41 are attached to the side of the chucking section 37. The probe grinder 40 serves to remove fine particles (or shavings of aluminium-oxidized film formed on the top of each electrode pad, for example) from the probes 10 at the time of pads checking. The TV camera 41 serves to adjust the relative position between the wafer holder 6 and the probe card 12.

The wafer center detecting section 28 for centering the wafer 4 and adjusting the position of an orientation flat 4a thereof is provided to the wafer carrying passage between the loader section 24 and the wafer holder 6. A wafer chuck 38, capable of rotating the wafer 4 rested thereon, is arranged in the wafer center detecting section 28. A discriminator unit 44 is fixed to the wafer center detecting section 28 by a bracket 46 to discriminate symbols and letters on the wafer 4 before and after the wafer probing step. An optical sensor 42 is attached to the under portion of the discriminator unit 44.

The operation of the wafer center detecting section 28 will be now described.

Figure 3:
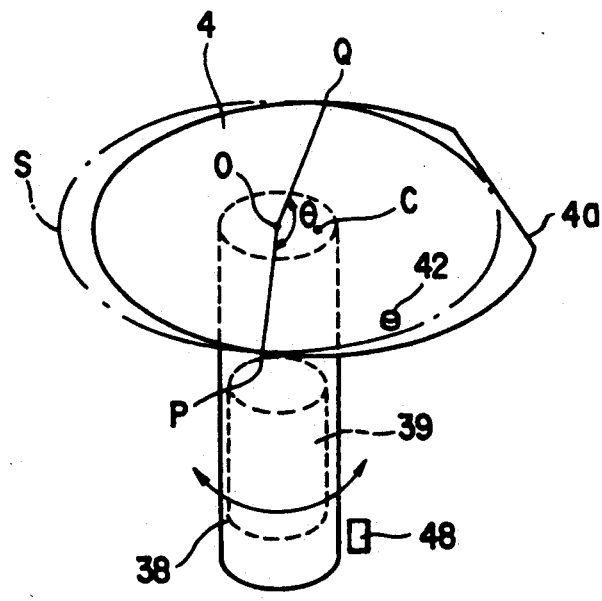
FIG. 3 is a perspective view showing the wafer center detecting device according to a first embodiment of the present invention.

As shown in FIG. 3, the wafer 4 which has been prealigned is vacuum-sucked on the wafer chuck 38. When the rotation center O of the wafer chuck 38 coincides with the center C of the wafer 4, the fictitious line of the wafer rim will be represented by S. The optical sensor 42 of the reflector type is positioned, facing this fictitious line S of the wafer rim, to optically detect the rim of the wafer 4.

As shown in FIG. 4, the wafer chuck 38 houses a stepping motor 39 therein, and a sensor 48 which is a rotary encoder is positioned adjacent to the wafer chuck 38 to detect the rotation angle of the wafer chuck 38. The stepping motor 39 and the rotation angle sensor 48 are connected directly to a control section 50, while the optical sensor 42 to the control section 50 via an A/D converter 43.

The optical sensor 42 of the reflector type includes a light receiving element 60 and plural (four in this case) light sources 62. The light receiving element 60 is attached to the underside of the optical sensor 42 at the center thereof and the light sources 62 to it along its rim, having a certain interval between them, as shown in FIGS. 5 and 6. Even when only one of the light sources 62 faces the wafer 4, its light is reflected by the wafer 4 and received by the light receiving element 60, so that it can be detected that the wafer 4 is present under the optical sensor 42. The optical sensor 42 of the reflector type can detect the presence of the wafer 4 under it even when the wafer 4 is made of transparent material such as quartz glass, crystal or gallium arsenic through which its detecting light can pass. For the sake of clarity, the optical sensor 42 is shown enlarged in relation to the wafer 4 in FIGS. 5 and 6, but its true size or dimension is only several millimeters.

As shown in FIG. 9, the control section 50 comprises input, CPU, RAM, memory and output units 51, 52, 53, 54 and 55 all connected to a bus line (BL). The optical sensor 42 is connected to a first terminal 51a of the input unit 51 through the A/D converter 43, while the rotation angle sensor 48 to a second terminal 51b thereof. The stepping motor 39 is connected to a terminal 55a of the output unit 55.

A method of detecting the center of a wafer will be described referring to a flow chart shown in FIG. 10. A program for the flow chart is previously inputted in the RAM 53 at the control section 50.

As shown in FIG. 3, the wafer 4 is carried onto the wafer chuck 38 by the handling arm 26 shown in FIG. 2, but the center C of the wafer 4 thus placed is usually shifted from the rotation center O of the wafer chuck 38.

Figure 8:
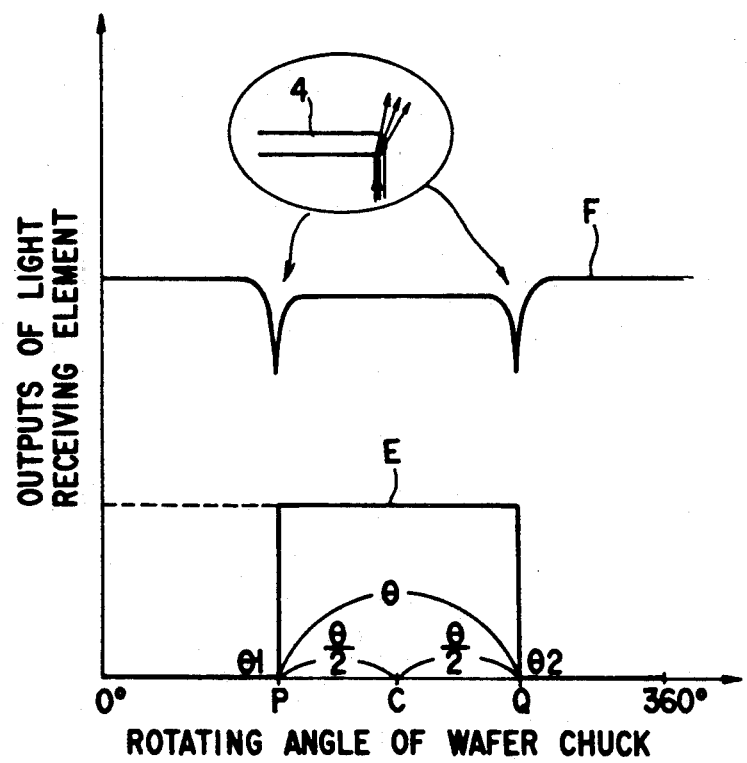
FIG. 8 is a waveform diagram showing the relation between the rotation of a wafer chuck and outputs of a light receiving element created by the rotation of the wafer chuck in the device according to the first embodiment of the present invention.

The stepping motor 39 is therefore rotated at a step 1 (S1) to rotate the wafer chuck 38 with the wafer 4 mounted thereon. The wafer 4 is detected by the optical sensor 42 at a step 2 (S2). This means that the wafer chuck 38 is stopped and that the fictitious rim line S of the wafer 4 is rotation-scanned by the optical sensor 42. When the wafer chuck 38 is rotated one time, points P and Q at which the true rim line of the wafer 4 crosses the fictitious rim line S thereof pass in front of the optical sensor 42. When the points P and Q pass under the optical sensor 42, the optical sensor 42 which has been opposed to the wafer 4 is made not opposed to the wafer 4 or the optical sensor 42 which has not been opposed to the wafer 4 is made opposed to the wafer 4. In short, the output of the optical sensor 42 becomes high when the optical sensor 42 is opposed to the wafer 4 but it becomes low when the optical sensor 42 is not opposed to the wafer 4, as shown in FIG. 8. Further, when the points P and Q pass under the optical sensor 42, outputs of the optical sensor 42 quickly decrease because light radiated from the optical sensor 42 is irregularly reflected by the rim of the wafer 4. These analog signals are therefore converted into digital ones of 1 and 0 by the A/D converter 43, as shown by E in FIG. 8. These digital signals are then inputted in the memory 54 while relating them with rotation angle signals applied from the rotation angle sensor 48.

Figure 7:
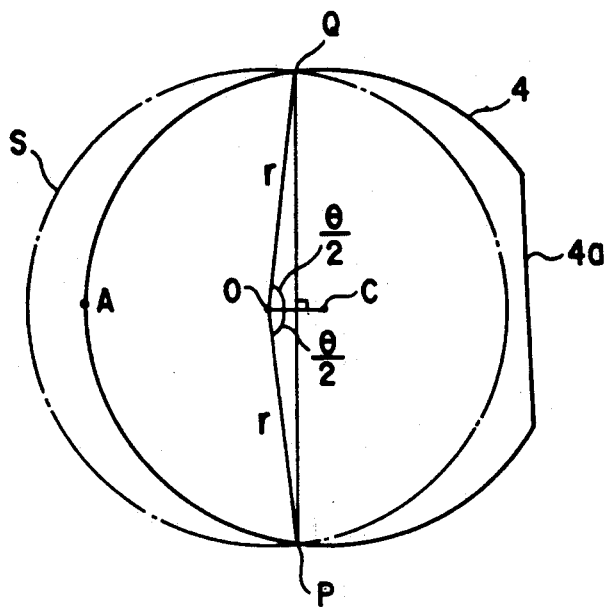
FIG. 7 is a plan showing the device in FIG. 3.

The stepping motor 39 is stopped at a step 3 (S3) when it is rotated one time. Angles $\theta_1$ and $\theta_2$ of points P and Q relative to a reference point A can be obtained from information stored in the memory 54 and the central angle $\theta$ can also be obtained from $\theta_2 - \theta_1$ at a step 4 (S4). When these angles of points P and Q relative to the reference point A are thus obtained, the direction OC in which the center C of the wafer 4 is shifted from the rotation center O of the wafer chuck 38 and the amount or extent L to which the wafer center C is shifted from the chuck center O can also be obtained from the geometric relation of two circles, as shown in FIG. 7, because the true and fictitious rim lines of the wafer 4 draw two circles. Namely, the shifted direction OC is on a straight line which bisects the central angle $\theta$ formed by points P and Q relative to the rotation center O of the wafer chuck 38 or on a straight line which vertically bisects a line extending between the points P and Q. In short, the shifted direction OC coincides with a line obtained by rotating the wafer chuck 38 from a line PO or QO only by $\theta/2$.

Because the rotation center 0 and the wafer center C are symmetrical in relation to a line PQ, the shifted amount or extent L can be obtained in the form of $L = 2r\cos(\theta/2)$ at a step 5 (S5). Coordinates of the center C of the wafer 4 can be obtained on the basis of the shifted direction OC and extent L of the wafer 4 at a step 6 (S6).

At a step 7 (S7), the wafer 4 is lifted by the handling arm 26 and transferred to the chucking section 37 of the wafer holder 6. The X- and Y-stages 32 and 36 of the holder 6 are then moved to position the rotation center O of the chuck 38 at the center coordinates of the wafer 4. The wafer 4 is again suction-held on the chuck 38 and the shifting of the wafer 4 is thus corrected.

Alternatively, when making the center coordinates of the wafer coincide with the origin, the handling arm 26 lifts the wafer 4 and is moved to make the previously-obtained center coordinates of the wafer 0, 0. The wafer 4 is again suction-hold on the chuck 38.

Finally, the stepping motor 39 is again rotated one time and output signals of the optical sensor 42 are checked at steps 8 and 9 (S8 and S9) to know whether or not the shifting of the wafer 4 have been completely corrected. When points P and Q are not detected, the wafer center detecting process is finished. When they are detected, however, the process is returned to the step 1 and the shift-correcting steps are again carried out.

The orientation flat (OF) 4a of the wafer 4 is also detected by the optical sensor 42 and OF detecting signal thus obtained is also inputted in the memory 54 at the step 1. However, the pattern of OF detecting signal is previously known. Therefore, the OF detecting signal can be canceled and only signals relating to the points P and Q can be picked up according to the program stored.

Another example of pre-aligning the wafer according to the above-described center detecting method will be described with reference to FIGS. 11A through 13B.

Figure 11A:
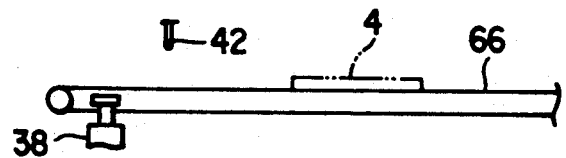
FIGS. 11A to 12B schematically show a carrier means for pre-aligning each wafer.
Figure 11B:
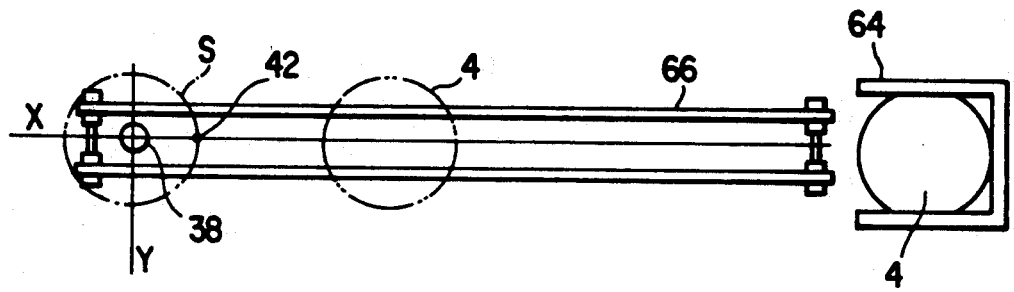
Figure 12A:
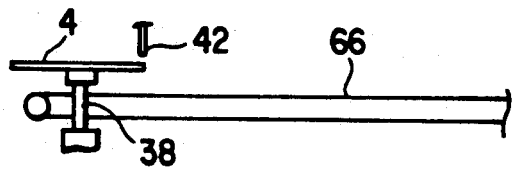
Figure 12B:
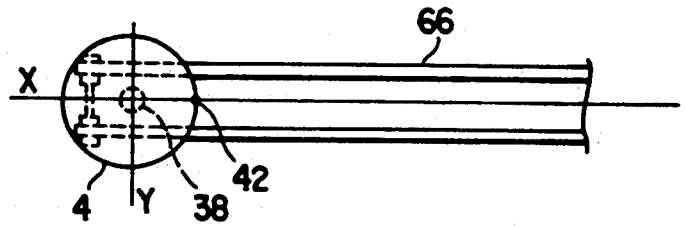

As shown in FIG. 11B, a cassette 64 in which a plurality of wafers are housed is provided and a belt conveyor 66 is located adjacent to the cassette 64 to carry the wafers one by one from the cassette 64 to the wafer chuck 38. The wafer 4 in the cassette 64 is rolled and transferred onto one end of the belt conveyor 66 by a transfer system (not shown) and then carried onto the wafer chuck 38, which is located at the other end of the belt conveyor 66, by the belt conveyor 66. When the wafer 4 is thus carried just above the wafer chuck 38, the belt conveyor 66 is stopped. The wafer chuck 38 is then lifted to suction-hold the wafer 4 thereon, as shown in FIG. 12A. The wafer 4 is thus located adjacent to the optical sensor 42. The wafer 4 on the wafer chuck 38 is shifted from the wafer chuck 38 because of its positional shifting at the time when it is transferred onto the belt conveyor 66 and also because of the stopping error of the belt conveyor 66.

Figure 13A:
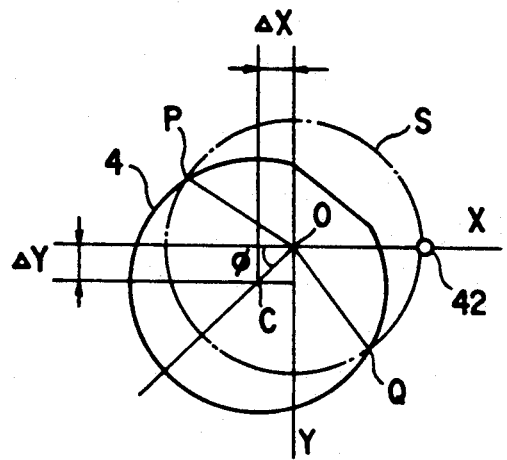
FIGS. 13A and 13B show the wafer shifted from the wafer chuck.

Detection outputs of the optical sensor 42 are sampled while rotating the wafer chuck 38 by the stepping motor (not shown), and points P and Q and then the shifting direction and extent are calculated in the same manner as in the first embodiment. When the carrying direction of the belt conveyor 66 is deemed as an X-axis and a horizontal axis perpendicular to the X-axis is deemed as a Y-axis, the center C of the wafer 4 is shifted from the rotation center O of the wafer chuck 38 by $\Delta X$ and $\Delta Y$, as shown in FIG. 13A. These positionally-shifted extents $\Delta X$ and $\Delta Y$ can be calculated from the shifting direction and extent OC and L according to the steps S4–S6 shown in FIG. 10. An angle $\phi$ formed by the X-axis and the shifting direction OC can also be obtained.

Figure 13B:
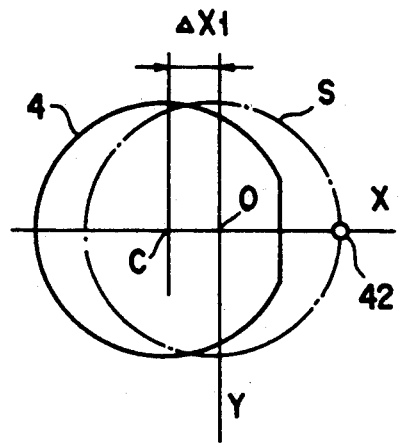

When the wafer chuck 38 is rotated clockwise from its state shown in FIG. 13A only by $\phi$ the shifting direction OC coincides with the X-axis, as shown in FIG. 13B, and the shifting extent $\Delta Y$ in the Y-axis direction becomes zero, leaving only the other shifting extent $\Delta X_1$ in the X-axis direction as it is. This shifting extent $\Delta X_1$ can be corrected by the belt conveyor 66.

The center detecting and aligning method to correct the shifting extent of the wafer in the X-axis direction according to a second embodiment of the present invention will be described with reference to FIGS. 14 to 15D.

Figure 14:
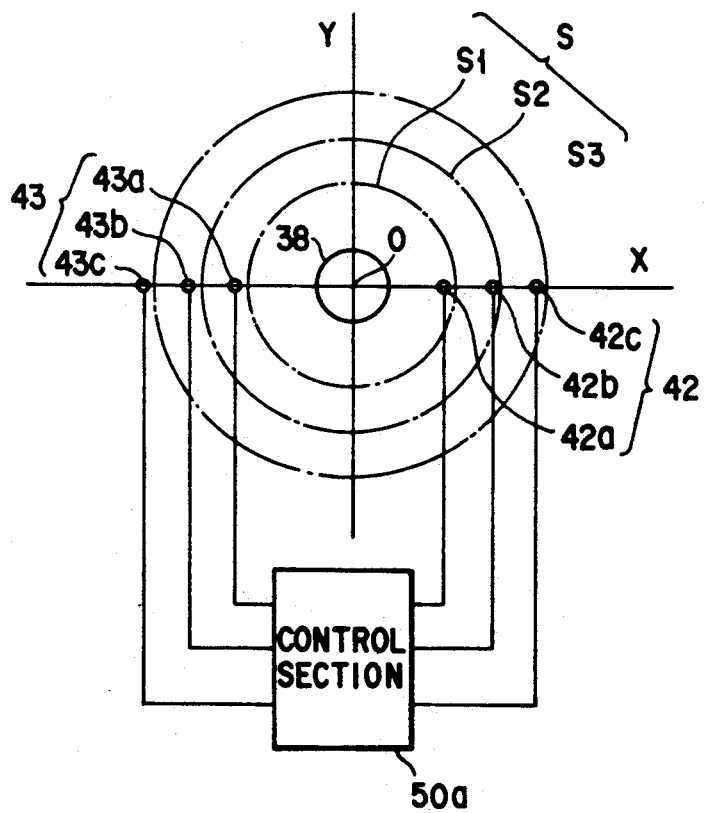
FIG. 14 schematically shows the wafer center detecting device according to a second embodiment of the present invention.

$S_1$, $S_2$ and $S_3$ in FIG. 14 denotes fictitious rim lines of 3-, 4- and 5-inch wafers and the line $S_1$ has a pair of optical sensors 42a, 43a, the line $S_2$ a pair of optical sensors 42b, 43b and the line $S_3$ a pair of optical sensors 42c, 43c. The optical sensors 42a, 42b and 42c are located a little inside (or about 1 mm inside) the rim lines $S_1$, $S_2$ and $S_3$, respectively, along the X-axis, while the other optical sensors 43a, 43b and 43c a little outside (or about 1 mm outside) the rim lines $S_1$, $S_2$ and $S_3$, respectively, along the X-axis. The optical sensors 42 and 43 are connected to a control section 50a which is provided with CPUs.

When the center C of the wafer 4 coincides with the rotation center O of the wafer chuck 38 or the former comes extremely near the latter, therefore, the light receiving element of the optical sensor 42 located inside the rim line S is under such a state that it receives light reflected, while the light receiving element of the optical sensor 43 located outside the rim line S is not under the state that it receives light reflected. It can be detected from this that the center C of the wafer 4 is shifted from the rotation center O of the wafer chuck 38.

Figure 15A:
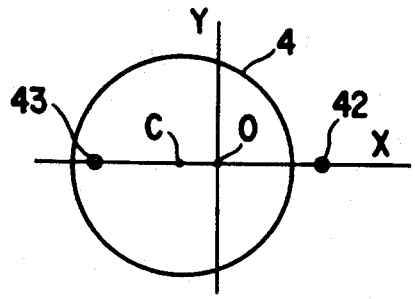
FIGS. 15A to 15D show how the center of the wafer is detected and aligned by the second device.
Figure 15C:
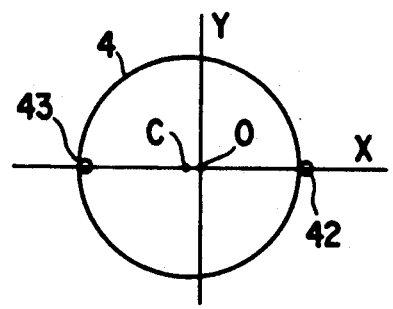
Figure 15B:
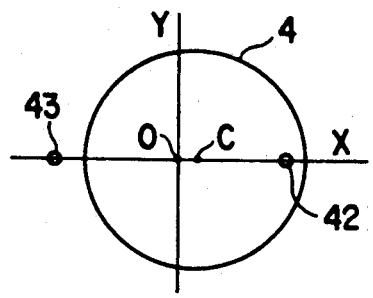
Figure 15D:
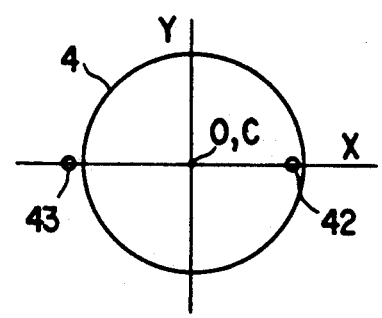

FIGS. 15A to 15D show a positioning or aligning method carried out on the basis of this center detection. FIG. 15A shows the wafer 4 shifted only in the X-axis direction as seen in FIG. 13B. The wafer 4 must be therefore moved from this state to right along the X—axis, but the extent of the wafer 4 moved along the X—axis is successively reduced from t to t/2, t/4 - - -, while moving the wafer 4 alternately right and left (see FIGS. 15A to 15D). When the wafer 4 is to be moved, the wafer chuck 38 is lowered to release the wafer 4 from it. The wafer 4 is therefore placed on the belt conveyor 66 and moved along the X—axis by the belt conveyor 66. When it is once moved, the wafer 4 is again mounted on the wafer chuck 38 and the wafer chuck 38 is rotated. This operation is repeated until the optical sensor 42 is opposed to the wafer 4 and the light receiving element of the optical sensor 42 is kept light-receiving.

The extent (t) of the wafer moved at first is determined by the upper limit value of the wafer shifted. The reduction rate of this wafer-moved extent (t) is not limited to ½ as described above.

When the center C of the wafer 4 is made to be in accord with the rotation center O of the wafer chuck 38 by the above-mentioned wafer-moving operation, the orientation flat (OF) 4a of the wafer 4 is aligned with a reference position. When the wafer chuck 38 is rotated, for example, outputs of the optical sensor 42 which is located inside the fictitious rim line S change at both ends of the OF4a. In order to align the OF4a of the wafer 4 with the reference position, therefore, it may be arranged that a line which vertically bisects the OF4a is obtained and that the wafer chuck 38 is rotated to align this vertically-bisecting line with the reference line or X-axis.

Figure 16:
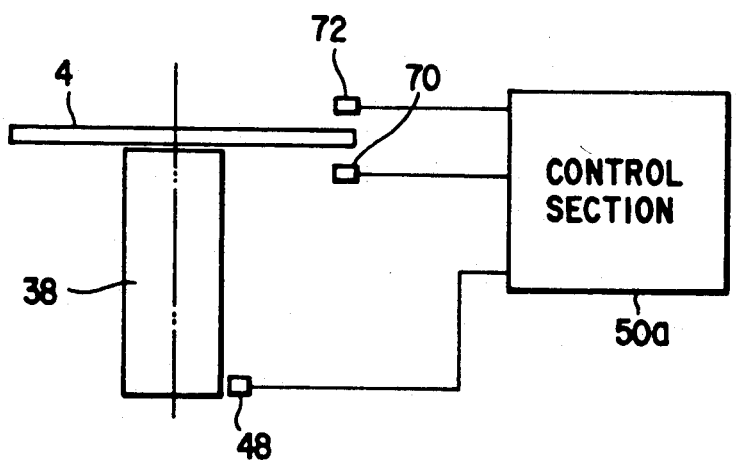
FIG. 16 schematically shows a variation of the optical sensor.

Although the wafer 4 has been optically detected by the optical sensors 42 and 43 of the reflector type in the above-described cases, an optical sensor 74 of the penetrating type comprising a light source 70 and light-receiving element 72 opposed to the light source 70 may be used as shown in FIG. 16. When the wafer 4 is made of transparent quartz glass in this case, light emitted from the light source 70 is diffused at the rim of the wafer 4 and the amount of light received by the light-receiving element 72 is reduced. The output F of the light-receiving element 72 is thus decreased. This enables the rim of the wafer 4 to be detected.

When a means such as the high quality robot hand is used to carry the wafer along the X- and Y-axes instead of carrying the wafer by the belt conveyor 66 as shown in FIGS. 11A to 12B, the center alignment between the wafer and the wafer chuck can be achieved only one time even though it is started from their state shown in FIGS. 13A or 13B.

Although the optical sensors 42 and 43 have been on the X-axis in FIG. 14, the optical sensor 43 may be located on the Y-axis or adjacent to the optical sensor 42.

Even when the optical sensors 42 and 43 which are located inside or outside the fictitious rim line S are used as shown in FIG. 14, no error is caused in measuring the shifting direction OC.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of detecting the center of a wafer comprising steps of:
   giving a turn to the wafer held by holder means;
   optically detecting two points at which the true rim line of the wafer crosses the fictitious rim line thereof obtained when the center of the wafer is in accord with the rotation center of the holder means, and measuring an angle formed by these two intersecting points relative to a reference point;
   obtaining from the angle formed by the two intersecting points a direction in which the center of the wafer is shifted from the rotation center of the holder means;
   obtaining a central angle formed by the two intersecting points relative to the rotation center of the holder means; and
   obtaining, on the basis of the central angle and a previously-measured wafer radius, the extent to which the center of the wafer is shifted from the rotation center of the holder means.

2. The wafer center detecting method according to claim 1, wherein the extent L of the wafer to be shifted can be obtained by an equation $L = 2r\cos(\theta/2)$ when the radius of the wafer is denoted by r and the central angle formed by the two intersecting points relative to the rotation center of the holder means is denoted by $\theta$.

3. The wafer center detecting method according to claim 1, further comprising steps of aligning the direction in which the wafer is shifted with a direction in which a wafer carrier means moves; and correcting the shifting of the wafer by the wafer carrier means.

4. The wafer center detecting method according to claim 1, wherein the two intersecting points are detected by an optical sensor of the reflector type comprising a light source for emitting light and a light receiving element for receiving light reflected by the wafer.

5. A device for detecting the center of a wafer comprising:
   holder means for holding the wafer freely rotatable;
   drive means for rotating the holder means;
   optical sensor means opposed to the fictitious rim line of the wafer obtained when the center of the wafer is in accord with the rotation center of the holder means so as to optically detect the rim of the wafer, said optical sensor means optically detecting two points at which the true rim line of the wafer crosses the fictitious rim line;
   means for detecting rotating angles of the holder means at which said optical sensor means senses said two points; and
   means for arithmetically calculating, on the basis of rotating angles of the holder means obtained when the rim of the rotating wafer is detected by the optical sensor means and a previously-measured wafer radius, the direction in and the extent to which the center of the wafer is shifted from the rotation center of the holder means said means for arithmetically calculating including means for: obtaining from an angle formed by the two intersecting points relative to a reference point a direction in which the center of the wafer is shifted from the rotation center of the holder means; obtaining a central angle formed by the two intersecting points relative to the rotation center of the holder means; and obtaining, on the basis of the central angle and the previously-measured wafer radius, the extent to which the center of the wafer is shifted from the rotation center of the holder means.

6. The wafer center detecting device according to claim 5, wherein the optical sensor is of the reflector type comprising a light source for emitting light and an element for receiving light reflected by the wafer.

7. The wafer center detecting device according to claim 5, further comprising means for carrying the wafer in a direction; and means for aligning the direction in which the wafer is shifted with the wafer carrying direction of the carrier means to correct the shifting of the wafer by the carrier means.

8. A method of detecting the center of a wafer comprising steps of:
   giving a turn to the wafer held by a holder means;
   optically detecting the presence of the wafer at two points located, when viewed in the radius direction of the wafer, a little inside and outside the fictitious rim line of the wafer obtained when the center of the wafer is in accord with the rotation center of the holder means, the distance between the two points being substantially equal to the diameter of the wafer;
   repeatedly reciprocating the wafer while successively reducing the extent of the wafer moved in a diameter direction of the wafer;
   rotating the wafer by the holder means every this reciprocating movement; and
   obtaining from information relating to whether or not the wafer is present at the above-mentioned two points the extent to which the center of the wafer is shifted from the rotation center of the holder means.

9. The wafer center detecting method according to claim 8, wherein the optical sensor is located about 1 mm inside or outside the fictitious rim line of the wafer when viewed in the radius direction of the wafer.

10. The wafer center detecting method according to claim 8, further comprising steps of detecting the orientation flat of the wafer by the optical sensor located inside the fictitious rim line of the wafer; and aligning the orientation flat of the wafer as desired while rotating the wafer.

11. The wafer center detecting method according to claim 8, wherein the extent of the wafer moved in a diameter direction of the wafer is reduced by ½ every this movement.

12. A device for detecting the center of a wafer comprising:
   holder means for holding the wafer freely rotatable;
   two optical sensors located, when viewed in the radius direction of the wafer, a little inside and outside the fictitious rim line of the wafer obtained when the center of the wafer is in accord with the rotation center of the holder means so as to optically detect the presence of the wafer, the distance between the two optical sensors being substantially equal to the diameter of the wafer; and
   means for obtaining the extent to which the wafer is shifted from the rotation center of the holder means on the basis of signals applied from the optical sensors when the wafer is rotated by the holder means.

13. The wafer center detecting device according to claim 12, wherein each optical sensor is of the reflector type comprising a light source for emitting light and an element for receiving light reflected by the wafer.

14. The wafer center detecting device according to claim 12, wherein the optical sensors are located about 1 mm inside or outside the fictitious rim line of the wafer when viewed in the radius dirrection of the wafer.

15. The wafer center detecting device according to claim 12, further comprising means for aligning the orientation flat of the wafer detected by the inside optical sensor while rotating the wafer.

16. The wafer center detecting device according to claim 12, further comprising means for reducing the extent of the wafer moved in the radius direction of the wafer by ½ every time when the wafer is moved.

17. An apparatus for probing a semiconductor wafer comprising:
   holder means for holding the wafer freely rotatable;
   two optical sensors located, when viewed in the radius direction of the wafer, a little inside and outside the fictitious rim line of the wafer obtained when the center of the wafer is in accord with the rotation center of the holder means so as to optically detect the presence of the wafer, the distance between the two optical sensor being substantially equal to the diameter of the wafer, said two optical sensors forming an optical sensing pair;
   means for obtaining, on the basis of signals applied from the optical sensors when the wafer is rotated by the holder means, the extent to which the center of the wafer is shifted from the rotation center of the holder means;

means for correcting the shifting of the wafer while moving the wafer; and means for checking electric characteristics of the wafer;

wherein said apparatus includes a plurality of said optical sensing pairs arranged in a line with distances between respective optical sensors of each pair being substantially equal to respective different diameters of wafers having different diameters.

* * * * *